United States Patent [19]
Hardee et al.

[11] Patent Number: 6,146,176
[45] Date of Patent: Nov. 14, 2000

[54] CONNECTOR FOR CONNECTING FIRST AND SECOND PARTS, ESPECIALLY PRINTED CIRCUIT BOARDS

[75] Inventors: Christy A. Hardee; Stefanie L. Speaker, both of Tacoma; Anthony P. Valpiani, Graham, all of Wash.

[73] Assignee: Intel Corporation, Santa Clara, Calif.

[21] Appl. No.: 09/384,369

[22] Filed: Aug. 27, 1999

[51] Int. Cl.[7] .................................................. H01R 13/62
[52] U.S. Cl. ............................. 439/310; 439/74; 439/372
[58] Field of Search .................................... 439/152, 153, 439/155, 157, 160, 310, 372, 74, 261; 361/754, 798

[56] References Cited

U.S. PATENT DOCUMENTS

| | | | |
|---|---|---|---|
| 4,497,528 | 2/1985 | Murtland | 439/160 |
| 4,597,173 | 7/1986 | Chino et al. | 439/160 |
| 4,638,405 | 1/1987 | Smith | 361/798 |
| 5,368,496 | 11/1994 | Ranalletta et al. | 439/372 |

*Primary Examiner*—Paula Bradley
*Assistant Examiner*—Tho D. Ta
*Attorney, Agent, or Firm*—Antonelli, Terry, Stout & Kraus, LLP

[57] ABSTRACT

A connector for connecting first and second parts, e.g., first and second printed circuit boards, includes a post having a first end fixedly connectable to the first part and a second end having an enlarged head, and a support having a base portion fixedly connectable to the second part and an aperture through which the post can be inserted in a first direction. A lever is mounted at a portion between its ends on a pivot provided on the support, the pivot having a longitudinal axis extending in a second direction perpendicular to the first direction. The lever has an engagement surface at one end substantially aligned with the aperture for engaging the enlarged head of the post. An application of force to another end of the lever in a direction opposite the first direction causes the lever to rotate about the pivot, causing the one end of the lever to move in the first direction towards a locked position, and drawing the enlarged head engaged by the engagement surface in the first direction, thereby forcing the first and second parts together.

34 Claims, 4 Drawing Sheets

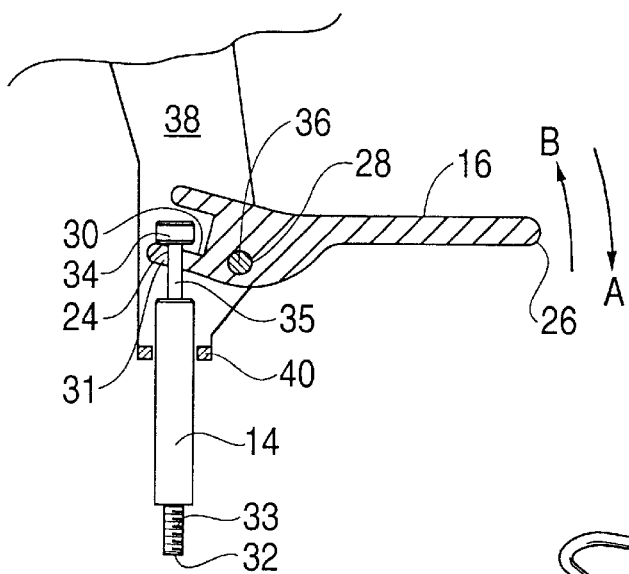
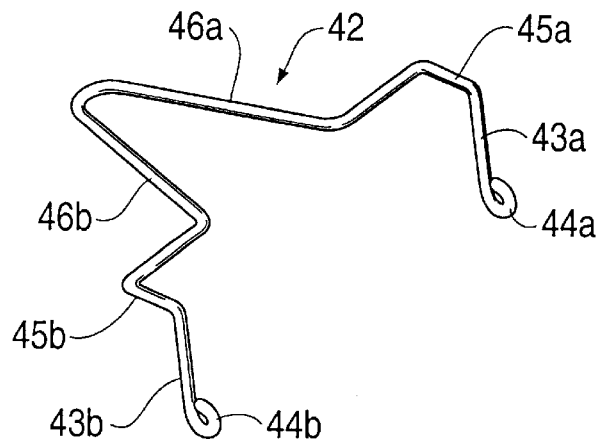
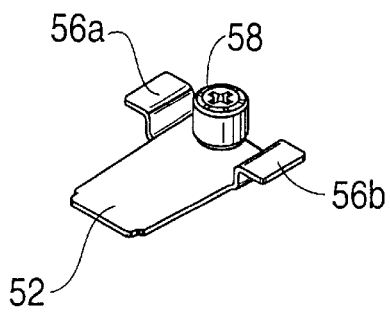
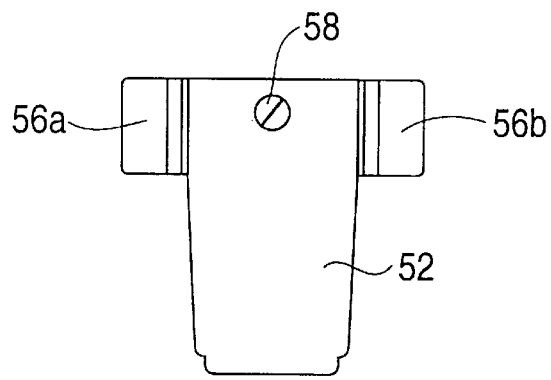

CONNECTOR FOR CONNECTING FIRST AND SECOND PARTS, ESPECIALLY PRINTED CIRCUIT BOARDS

FIELD

The present invention relates to a connector for connecting first and second parts, e.g., first and second printed circuit boards, as well as to the first and second parts, e.g., first and second printed circuit boards, connected thereby.

BACKGROUND

Card guides and pullers are known for guiding, pulling and fastening circuit boards or cards in a guide rack or chassis. For example, Richco of Chicago, Ill., sells card guides and pullers which serve to insert, extract and secure cards in place. For example, Richco's R1001 series card guide and puller comprises a lever-like handle mounted to pivot about a corner of a card. One end of the handle can be used for inserting or extracting the card, while the other end includes a ledge which can secure the card by cooperating with a C-channel. However, such a card guide and puller is not useful for assembling two parts, e.g., printed circuit boards to one another, especially when the substrates of the parts are parallel to one another.

SUMMARY

The present invention relates to a connector for connecting first and second parts, the connector including a post having a first end fixedly connectable to the first part and a second end having an enlarged head, and a support having a base portion fixedly connectable to the second part and having an aperture through which the post can be inserted in a first direction. A lever is mounted at a portion between its ends on a pivot provided on the support, the pivot having a longitudinal axis extending in a second direction perpendicular to the first direction. The lever has an engagement surface at one end substantially aligned with the aperture for engaging the enlarged head of the post. An application of force to another end of the lever in a direction opposite the first direction causes the lever to rotate about the pivot, causing the one end of the lever to move in the first direction towards a locked position, and drawing the enlarged head engaged by the engagement surface in the first direction, thereby forcing the first and second parts together.

BRIEF DESCRIPTION OF THE DRAWING(S)

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 5 is a cross-sectional view of a portion of a connector according to an embodiment of the present invention;

FIG. 6 is a perspective view of one embodiment of a locking mechanism according to the present invention;

FIG. 7A is a perspective view of another embodiment of a locking mechanism according to the present invention;

FIG. 7B is a plan view of the locking mechanism of FIG. 7A;

DETAILED DESCRIPTION

Figure 1:
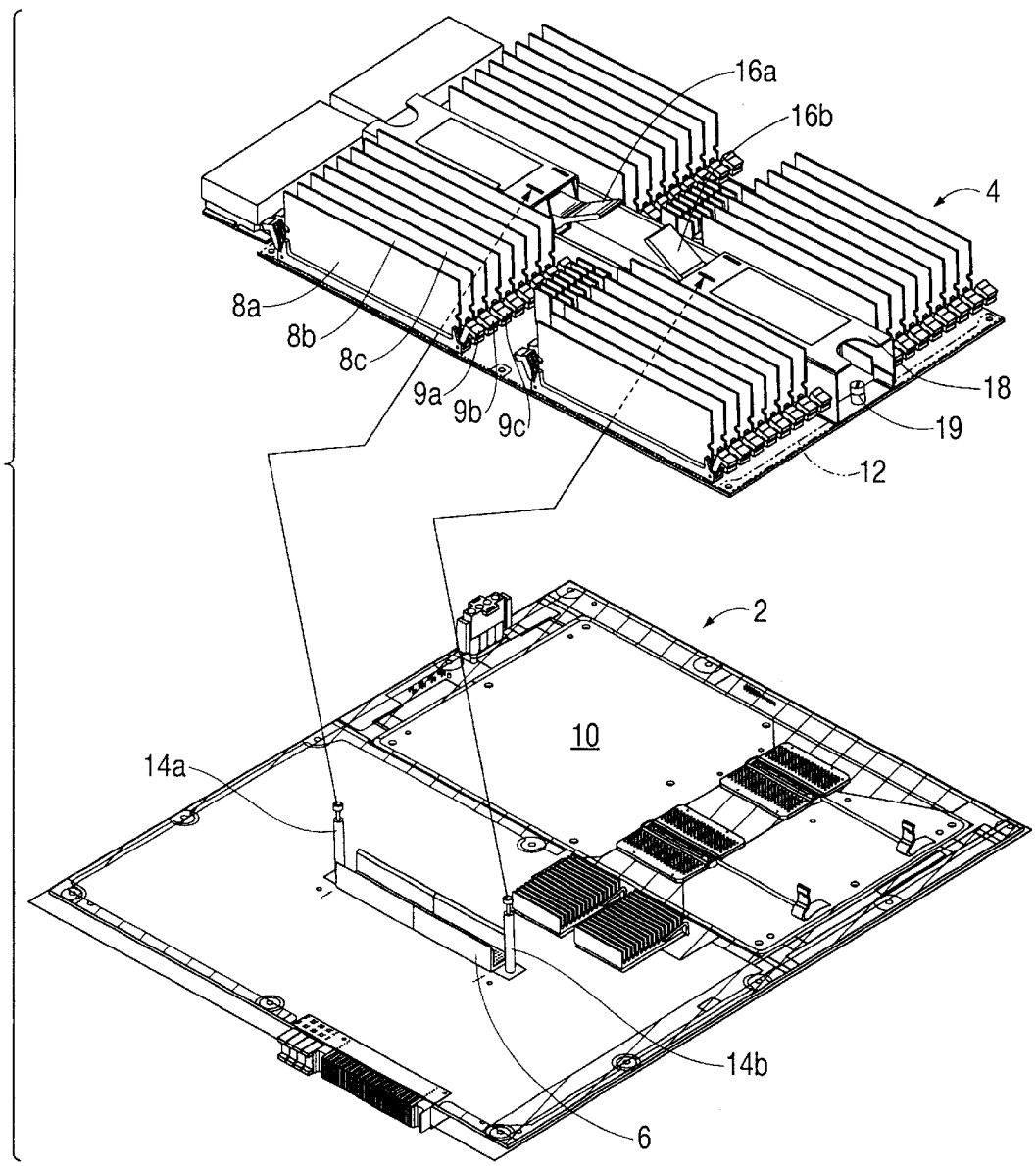
FIG. 1 is an exploded view of two parts, e.g. first and second printed circuit boards, connectable together by a connector according to an embodiment of the present invention.

In the following description, like reference numerals and characters may be used to designate identical, corresponding or similar components in differing figured drawings.

FIG. 1 is an exploded view schematically showing two parts, e.g., printed circuit boards 2, 4, connectable together. While the two parts shown in this embodiment are printed circuit boards 2, 4, the present invention can be used to connect any two parts together. In the embodiment shown in FIG. 1, printed circuit board 2 is a processor board while printed circuit board 4 is a memory board. As is known, the processor board 2 contains female/male interconnections 6. In the embodiment shown in FIG. 1, the female/male interconnection 6 electrically connect to corresponding male/female interconnections on the bottom of memory board 4. For the sake of simplicity, the usual components of processor board 2 are not shown or shown schematically. Memory board 4 includes a plurality of memory cards 8a, 8b, 8c . . . held in place on memory board 4 by clips 9a, 9b, 9c, etc.. In the embodiment shown in FIG. 1, the substrates 10, 12 of printed circuit boards 2, 4 are connected together such that the substrates 10, 12 are provided parallel to one another. The boards 2, 4, can be used, e.g., in a server.

The two parts 2, 4 were physically connected together by a connector which includes posts 14a, 14b which are fixably connected to part 2. The posts 14a, 14b can be engaged with levers 16a, 16b mounted in support 18 which is fixedly connected, e.g., by screws 19 and/or rivets to the second part 4. The support 18 can extend at least partially across the part 4 or, as in the embodiment shown in FIG. 1, substantially completely across the memory board 4.

Figure 2A:
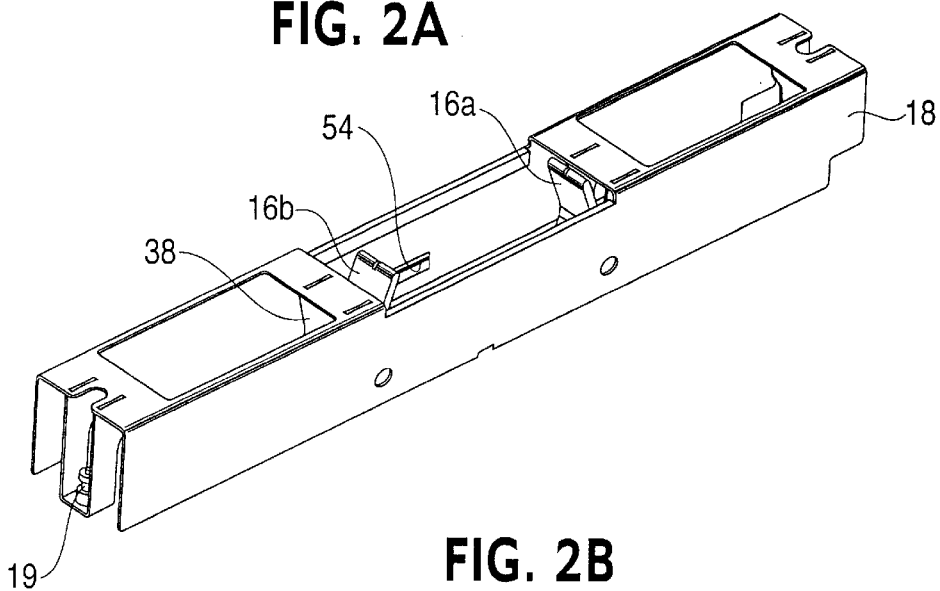
FIG. 2A is a perspective view of a part of a connector according to an embodiment of the present invention.
Figure 2B:
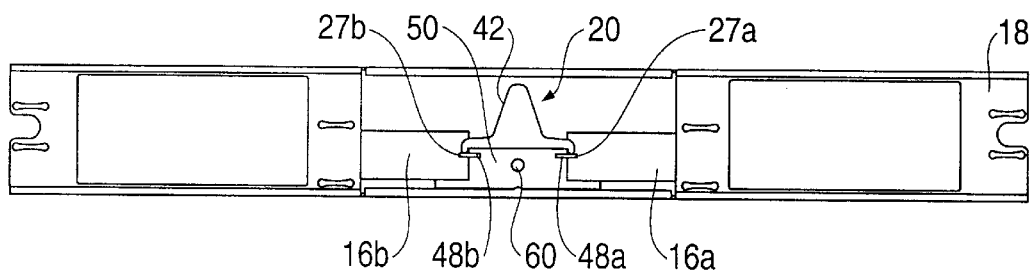
FIG. 2B is a plan view of a part of the connector of FIG. 2A.

The support 18 in this embodiment is made of a material and has a shape and size sufficient to serve as a stiffener for the memory board 4 and to serve as a convenient handle for inserting and extracting the memory board 4. If the support 18 is placed substantially in the middle of the board 4, as shown in the embodiment of FIG. 1, the memory board 4 can be inserted and extracted conveniently, i.e. directly outwardly from board 2, without bending the pins of the interconnections 6. For example, the support 18 can be made from steel having a black powder coat. The support 18, including the levers 16a, 16b is shown with the levers in the unlocked or extraction position in FIGS. 1 and 2A, and with the levers 16a, 16b in the locked position in FIG. 2B. In FIG. 2B, the levers 16a, 16b are locked with a locking mechanism generally designated by the reference numeral 20, as will be explained hereinafter.

Figure 3:
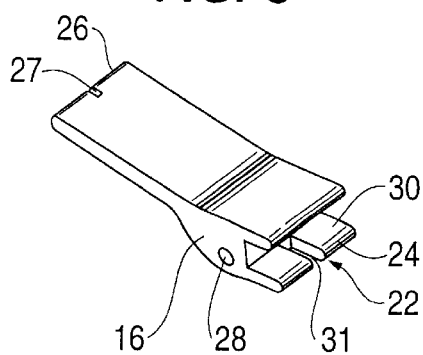
FIG. 3 is a perspective view of a lever used in the connector according to an embodiment of the present invention.

FIG. 3 shows a lever 16 in detail in a perspective view. Each lever 16 has an engagement surface 22 at one end 24. The other end 26 of the lever 16 includes a slot 27 for engaging the locking mechanism 20. The lever 16 can be mounted on the support at a portion between its ends 24, 26 on a pivot (not shown in FIG. 3), which extends through aperture 28 in lever 16. In the embodiment shown, the engagement surface 22 comprises a ledge 30 having a slot 31 provided therein. The engagement surface 22 engages a portion of the pin 14, as will be described hereinafter.

Figure 4:
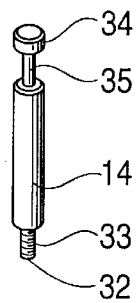
FIG. 4 is a perspective view of a post used in a connector according to an embodiment of the present invention.

As shown in FIG. 4, each pin 14 includes a first end 32 which is fixedly connectable to one of the parts, e.g., to the processor board 2, by, e.g., a threaded portion 33 which can be screwed into a mating female threaded portion on part 2. Each post 14 has an enlarged head 34 and, in this embodiment, a narrow neck 35 adjacent to the enlarged head 34. The narrow neck 35 has a diameter smaller than that of the enlarged head 34.

As more clearly shown in FIG. 5, the post 14 is engaged by the lever 16 by inserting the narrowed neck 35 into the slot 31 of the lever 16. The enlarged head 34 of the post 14 is supported by the ledge 30. The lever 16 is mounted on pivot 36 which is provided in aperture 28 of the lever 16 and extends on either side of the lever 16 into a bracket 38 on support 18. As can be appreciated, the pin 14 is inserted through a hole in the base 40 of the bracket 38 which aligns with a corresponding hole in the part 4.

FIG. 5 shows the lever 16 in the locked position. As can be appreciated, the locked position is achieved by applying force to the end 26 of the lever 16 in the direction A, thereby causing the lever 16 to rotate about the pivot 36 so that the end 24 in the direction opposite to the direction of end 26, drawing the parts 2 and 4 together. The released position is achieved by pulling up on the end 26 of the lever 16 in the direction B causing the lever 16 to rotate about pivot 36, thereby moving end 24 of the lever in the direction opposite to the direction of movement of end 26, releasing the enlarged head 34 from the slot 31 in ledge 30 of the lever. By pulling on the lever 16 or on the support 18, the part 4 can be extracted.

As shown in FIG. 2B, the levers 16a, 16b are maintained in the locked position by a locking mechanism 20, which, in this embodiment includes a wire lock 42, shown in more detail in FIG. 6.

As shown in FIG. 6, the wire lock 42 includes legs 43a, 43b which extends through slots 48a, 48b, respectively in bracket 50 of support 18. Hooked ends 44a, 44b prevent legs 43a, 43b, respectively, from being removed from the bracket 50. In the locked position, legs 43a, 43b of wire lock 42 are inserted in slots 27a, 27b, respectively, of levers 16a, 16b. In the locked position, shoulders 45a, 45b of the wire lock 42 rest on the top surface of the levers 16a, 16b, respectively, locking the levers in position. In order to unlock the levers for extraction, wire portions 46a, 46b are squeezed towards one another to remove legs 43a, 43b from slots 27a, 27b and to allow the ends 26 of the levers to be free from the shoulders 45a, 45b of the wire lock 42. The levers can then be moved in the direction B shown in FIG. 5 for extraction.

While a wire lock 42 is shown in FIGS. 2B and FIG. 6, any mechanism for locking the levers in place can be used. For example, an alternative locking mechanism is shown in FIGS. 7A and 7B. In the embodiment shown in FIG. 7A and 7B, a lab 52 extends from within the support 18 through the slot 54 shown in FIG. 2A. In the locked position, the wings 56a, 56b are slid over the top of the ends 26 of levers 16a, 16b, respectively to lock the levers in place. The locking mechanism in this embodiment can be secured in the locked position by screw 58 which can be screwed through hole 60 in bracket 50 (see FIG. 2B). In the extraction position, the tab 52 can be slid outwardly through slot 54 to free the end of the levers.

Figure 8:
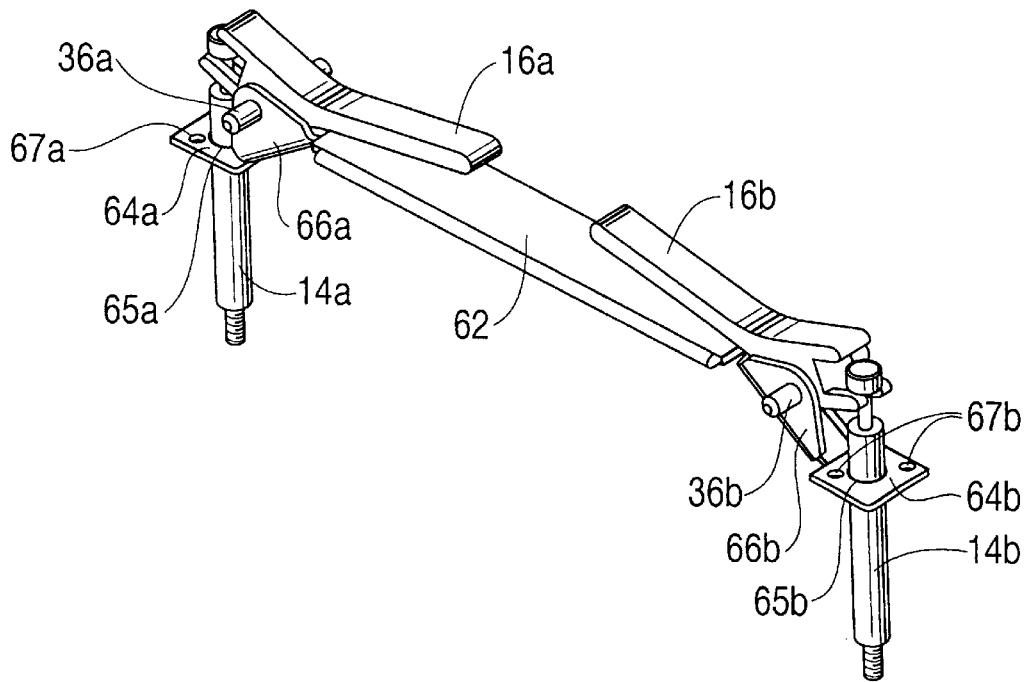
FIG. 8 is a perspective view of a connector according to another embodiment of the present invention.
Figure 9:
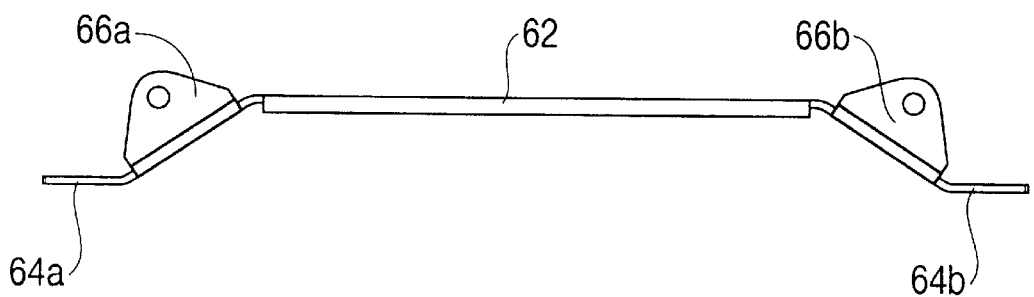
FIG. 9 is a side view of a part of the connector of FIG. 8.

An alternative connector assembly is shown in FIGS. 8 and 9. In one embodiment shown in FIGS. 8 and 9, the levers 16a, 16b cooperate with pins 14a, 14b in the same manner as in the previously described embodiment. However, in this embodiment, the levers 16a, 16b are mounted using pivots 36a, 36b on a handle 62. The handle 62 includes base portions 64a, 64b having apertures 65a, 65b through which pins 14a, 14b, respectively, can be inserted. The apertures 65a, 65b would be aligned with corresponding apertures in part 4.

The handle 62 can be attached to part 4, e.g., using screws through apertures 67a, 67b in base portions 64a, 64b, respectively. The handle 62 includes intermediate portions 66a, 66b to which the levers 16a, 16b are attached using pivots 36a, 36b. The handle 62 can be made, e.g., of sheetmetal and can be coated with an insulating material or attached to an insulating spacer, e.g., a plastic spacer, to keep the sheetmetal from disrupting traces on the board and to provide additional height to the handle.

While, in the foregoing embodiments, the pins 14 have been shown to be substantially cylindrical and the levers 16 to have corresponding engagement surfaces 22 (e.g., including a slot 31 and ledge 30), the post can have any desired shape as long as the levers 16 have a mating engagement shape. For example, the post could have a longitudinally extending ledge engaged by the ledge 30 of the lever. Any other shapes are possible, as long as the posts 14 have heads which can be engaged with corresponding engagement surfaces 22 of the levers 16.

The present invention allows two parts, especially two parts having parallel spaced substrates to be engaged without the need for excessive engagement force. This is especially advantageous in connection with connecting two printed circuit boards, e.g., a memory board to a processor board. If the connectors of the boards had to be engaged by hand, the engagement force required could be excessive. In addition, with vertically mounted connectors, the optimal area to push would be directly above the connector, which is populated by the ends of the pins. A highly populated board may not even allow adequate space on the board to apply the needed force. The present invention reduces the force required to engage the connectors and makes it easier to apply that force. Thus, the connector of the present invention can be used to assemble two printed circuit boards of very high connector insertion/extraction forces (greater than 20 pounds). In addition, the connector avoids deflection of the boards during insertion/engagement and disengagement/removal.

This concludes the description of the preferred embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A connector for connecting first and second parts, comprising:
   a post having a first end fixedly connectable to the first part and a second end having an enlarged head;
   a support having a base portion fixedly connectable to the second part and an aperture through which the post can be inserted in a first direction; and
   a lever mounted at a portion between its ends on a pivot provided on the support, the pivot having a longitudinal axis extending in a second direction perpendicular to the first direction, the lever having an engagement surface at one end substantially aligned with the aperture for engaging the enlarged head of the post, whereby an application of force to another end of the lever in a direction opposite the first direction causes the lever to rotate about the pivot at an angle of less than 180°, causing the one end of the lever to move in the first direction towards a locked position, and drawing the enlarged head engaged by the engagement surface in the first direction, thereby forcing the first and second parts together.

2. A connector according to claim 1, wherein the post is substantially cylindrical and wherein the first end of the post comprises a threaded portion for connection to a mating threaded portion on said first part.

3. A connector according to claim 2, wherein the post comprises a narrowed neck adjacent to and having a diameter smaller than a diameter of the enlarged head, and wherein the engagement surface of the lever comprises a ledge provided at the one end, the ledge including a slot extending inwardly from the one end and having a width larger than the diameter of the narrowed neck and smaller than the diameter of the enlarged head, whereby the enlarged head is engaged by the engagement surface by inserting the narrowed neck into the slot with the enlarged head supported by the ledge.

4. A connector for connecting first and second printed circuit boards, comprising:
   a post having a first end fixedly connectable to the first printed circuit board and a second end having an enlarged head;
   a support having a base portion fixedly connectable to the second printed circuit board and an aperture through which the post can be inserted in a first direction, the aperture being provided in a location which can be aligned with an aperture in the second printed circuit board; and
   a lever mounted at a portion between its ends on a pivot provided on the support, the pivot having a longitudinal axis extending in a second direction perpendicular to the first direction, the lever having an engagement surface at one end substantially aligned with the aperture for engaging the enlarged head of the post, whereby an application of force to another end of the lever in a direction opposite to the first direction causes the lever to rotate about the pivot at an angle of less than 180°, causing the one end of the lever to move in the first direction towards a locked position, and drawing the enlarged head engaged by the engagement surface in the first direction, thereby forcing the first and second printed circuit boards together.

5. A connector according to claim 4, wherein the post is substantially cylindrical and wherein the first end of the post comprises a threaded portion for connection to a mating threaded portion on said first part.

6. A connector according to claim 5, wherein the post comprises a narrowed neck adjacent to and having a diameter smaller than a diameter of the enlarged head, and wherein the engagement surface of the lever comprises a ledge provided at the one end, the ledge including a slot extending inwardly from the one end and having a width larger than the diameter of the narrowed neck and smaller than the diameter of the enlarged head, whereby the enlarged head is engaged by the engagement surface by inserting the narrowed neck into the slot with the enlarged head supported by the ledge.

7. A pair of printed circuit boards connectable together by a connector, comprising:
   a first printed circuit board;
   a post having a first end fixedly connected to the first printed circuit board and a second end having an enlarged head;
   a second printed circuit board;
   a support having a base portion fixedly connected to the second printed circuit board and an aperture, aligned with an aperture in the second printed circuit board, the post being inserted in a first direction through the aperture in the second printed circuit board and through the aperture in the support; and
   a lever mounted at a portion between its ends on a pivot provided on the support, the pivot having a longitudinal axis extending in a second direction perpendicular to the first direction, the lever having an engagement surface at one end substantially aligned with the aperture and engaging the enlarged head of the post, whereby an application of force to another end of the lever in a direction opposite the first direction causes the lever to rotate about the pivot at an angle of less than 180°, causing the one end of the lever to move in the first direction towards a locked position, and drawing the enlarged head engaged by the engagement surface in the first direction, thereby forcing the first and second printed circuit boards together.

8. A connector according to claim 7, wherein the base portion of the support is fixedly connected to the second printed circuit board by screws.

9. A connector according to claim 7, wherein the first printed circuit board is a processor board and the second printed circuit board is a memory board, and wherein the first and second boards are connected such that substrates of the first and second boards are parallel to one another.

10. A connector according to claim 7, wherein the post is substantially cylindrical and wherein the first end of the post comprises a threaded portion for connection to a mating threaded portion on said first part.

11. A connector according to claim 10, wherein the post comprises a narrowed neck adjacent to and having a diameter smaller than a diameter of the enlarged head, and wherein the engagement surface of the lever comprises a ledge provided at the one end, the ledge including a slot extending inwardly from the one end and having a width larger than the diameter of the narrowed neck and smaller than the diameter of the enlarged head, whereby the enlarged head is engaged by the engagement surface by inserting the narrowed neck into the slot with the enlarged head supported by the ledge.

12. A connector for connecting first and second parts, comprising:
   a plurality of posts, each post having a first end fixedly connectable to the first part and a second end having an enlarged head;

a support having a base portion fixedly connectable to the second part and a plurality of apertures through which the respective posts can be inserted in a first direction, the apertures being provided in locations which can be aligned with apertures in the second part; and a plurality of levers, each lever being mounted at a portion between its ends on a pivot provided on the support, the pivot having a longitudinal axis extending in a second direction perpendicular to the first direction, each lever having an engagement surface at one end substantially aligned with one of the plurality of apertures for engaging the enlarged head of one of the plurality of posts, whereby an application of force to another end of the lever in a direction opposite the first direction causes the lever to rotate about the pivot, causing the one end of the lever to move in the first direction towards a locked position, and drawing the enlarged head engaged by the engagement surface on the first direction, thereby forcing the first and second parts together.

13. A connector according to claim 12, further comprising a locking mechanism for locking the levers in the locked position.

14. A connector according to claim 12, wherein the post is substantially cylindrical and wherein the first end of the post comprises a threaded portion for connection to a mating threaded portion of said first part.

15. A connector according to claim 14, wherein the post comprises a narrowed neck adjacent to and having a diameter smaller than a diameter of the enlarged head, and wherein the engagement surface of the lever comprises a ledge provided at the one end, the ledge including a slot extending inwardly from the one end and having a width larger than the diameter of the narrowed neck and smaller than the diameter of the enlarged head, whereby the enlarged head is engaged by the engagement surface by inserting the narrowed neck into the slot with the enlarged head supported by the ledge.

16. A connector according to claim 12, wherein two posts are provided and two levers are mounted symmetrically in the support.

17. A connector according to claim 16, further comprising a locking mechanism for locking the levers in the locked position.

18. A connector for connecting first and second printed circuit boards, comprising:

a plurality of posts, each post having a first end fixedly connectable to the first printed circuit board and a second end having an enlarged head;

a support having a base portion fixedly connectable to the second printed circuit board and a plurality of apertures through which the respective posts can be inserted in a first direction, the apertures being provided in locations which can be aligned with apertures in the second printed circuit board; and a plurality of levers, each level being mounted at a portion between its ends on a pivot provided on the support, the pivot having a longitudinal axis extending in a second direction perpendicular to the first direction, each lever having an engagement surface at one end substantially aligned with one of the plurality of apertures for engaging the enlarged head of one of the plurality of posts, whereby an application of force to another end of the lever in a direction opposite the first direction causes the lever to rotate about the pivot, causing the one end of the lever to move in the first direction towards a locked position, and drawing the enlarged head engaged by the engagement surface in the first direction, thereby forcing the first and second printed circuit boards together.

19. A connector according to claim 18, further comprising a locking mechanism for locking the levers in the locked position.

20. A connector according to claim 18, wherein the post is substantially cylindrical and wherein the first end of the post comprises a threaded portion for connection to a mating threaded portion on said first part.

21. A connector according to claim 20, wherein the post comprises a narrowed neck adjacent to and having a diameter smaller than a diameter of the enlarged head, and wherein the engagement surface of the lever comprises a ledge provided at the one end, the ledge including a slot extending inwardly from the one end and having a width larger than the diameter of the narrowed neck and smaller than the diameter of the enlarged head, whereby the enlarged head is engaged by the engagement surface by inserting the narrowed neck into the slot with the enlarged head supported by the ledge.

22. A connector according to claim 18, wherein two posts are provided and two levers are mounted symmetrically in the support.

23. A connector according to claim 22, further comprising a locking mechanism for locking the levers in the locked position.

24. A pair of printed circuit boards connectable together by a connector, comprising:

a first printed circuit board;

a plurality of posts, each post having a first end fixedly connected to the first printed circuit board and a second end having an enlarged head;

a second printed circuit board;

a support extending at least partially across the second printed circuit board and having a base portion fixedly connected to the second printed circuit board and a plurality of apertures, aligned with a plurality of apertures in the second printed circuit board, the posts being inserted in a first direction through the apertures in the second printed circuit board and through the apertures in the support; and a plurality of levers, each lever mounted at a portion between its ends on a pivot provided on the support, the pivot having a longitudinal axis extending in a second direction perpendicular to the first direction, each lever having an engagement surface at one end substantially aligned with an aperture and engaging the enlarged head of one of the plurality of posts, whereby an application of force to another end of each lever in a direction opposite the first direction causes the lever to rotate about the pivot, causing the one end of the lever to move in the first direction towards a locked position, and drawing the enlarged head engaged by the engagement surface in the first direction, thereby forcing the first and second printed circuit boards together.

25. A connector according to claim 24, further comprising a locking mechanism for locking the levers in the locked position.

26. A connector according to claim 24, wherein the base portion of the support is fixedly connected to the second printed circuit board by screws.

27. A connector according to claim 26, wherein the post is substantially cylindrical and wherein the first end of the post comprises a threaded portion for connection to a mating threaded portion on said first part.

28. A connector according to claim 27, wherein the post comprises a narrowed neck adjacent to and having a diameter smaller than a diameter of the enlarged head, and wherein the engagement surface of the lever comprises a ledge provided at the one end, the ledge including a slot extending inwardly from the one end and having a width larger than the diameter of the narrowed neck and smaller than the diameter of the enlarged head, whereby the enlarged head is engaged by the engagement surface by inserting the narrowed neck into the slot with the enlarged head supported by the ledge.

29. A connector according to claim 24, wherein two posts are provided and two levers are mounted symmetrically in the support.

30. A connector according to claim 29, further comprising a locking mechanism for locking the levers in the locked position.

31. A connector according to claim 24, wherein the first printed circuit board is a processor board and the second printed circuit board is a memory board, and wherein the first and second boards are connected such that substrates of the first and second boards are parallel to one another.

32. A connector according to claim 31, wherein the support extends substantially completely across the second printed circuit board and serves as a stiffener for the second printed circuit board and as a handle for extraction of the second printed circuit board from the first printed circuit board.

33. A connector according to claim 24, wherein the first and second boards are connected such that substrates of the first and second boards are parallel to one another.

34. A connector according to claim 33, wherein the support extends substantially completely across the second printed circuit board and serves as a stiffener for the second printed circuit board and as a handle for extraction of the second printed circuit board from the first printed circuit board.

* * * * *